(12) United States Patent
Kim

(10) Patent No.: US 7,276,758 B2
(45) Date of Patent: Oct. 2, 2007

(54) NON-VOLATILE MEMORY HAVING THREE STATES AND METHOD FOR MANUFACTURING THE SAME

(75) Inventor: Kyung Do Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 149 days.

(21) Appl. No.: 11/121,639

(22) Filed: May 4, 2005

(65) Prior Publication Data

US 2006/0220095 A1 Oct. 5, 2006

(30) Foreign Application Priority Data

Mar. 15, 2005 (KR) ............... 10-2005-0021388

(51) Int. Cl.
*H01L 29/788* (2006.01)
(52) U.S. Cl. ............... 257/315; 257/E29.272; 257/E29.164
(58) Field of Classification Search ........ 257/E29.272, 257/E27.104, 315
See application file for complete search history.

(56) References Cited

U.S. PATENT DOCUMENTS

2006/0054943 A1* 3/2006 Li et al. .............. 257/266

* cited by examiner

*Primary Examiner*—B. William Baumeister
*Assistant Examiner*—Amar Movva
(74) *Attorney, Agent, or Firm*—Ladas & Parry LLP

(57) ABSTRACT

Disclosed is a non-volatile memory having three data states and a method for manufacturing the same. The non-volatile memory includes a silicon substrate having a device separation film; a floating gate formed on the silicon substrate; a tunnel oxide film interposed between the silicon substrate and the floating gate below both ends of the floating gate; a ferroelectric substance interposed between the silicon substrate and the floating gate inside the tunnel oxide film; a diffusion barrier film enclosing the ferroelectric substance; a control gate formed on the substrate including the floating gate; a gate oxide film formed below the control gate; spacers formed on both lateral walls of the laminated floating gate and control gate including the tunnel oxide film and gate oxide film, respectively; and source/drain regions formed within the substrate surfaces on both sides of the control gate including the spacers, respectively.

6 Claims, 7 Drawing Sheets

NON-VOLATILE MEMORY HAVING THREE STATES AND METHOD FOR MANUFACTURING THE SAME

BACKGROUND OF THE INVENTION

1. Field of the Invention

The present invention relates to a memory, and more particularly to a non-volatile memory having three data states and a method for manufacturing the same.

2. Description of the Prior Art

As generally known in the art, in the case of conventional volatile memories including DRAMs and SRAMs and non-volatile memories including flashes, each cell has one of two value states of "0" and "1." Specifically, in the case of DRAMs, each cell has one of two data states of "0" and "1" depending on whether it has stored electrical charge in the capacitor or not. In the case of SRAMS, each cell has one of two data states of "0" and "1" depending on whether it is latched or not. In the case of flash memories, as shown in FIG. 1, each cell has one of two data states of "0" and "1" depending on whether it has injected electrons into the floating gate 3a or not, which corresponds to each of two threshold voltages.

It can be understood, therefore, that the capacity of conventional volatile and non-volatile memories is equal to the number of entire memory cells.

In FIG. 1, reference numeral 1 refers to a silicon substrate; 2 is a device separation film; 3 is a tunnel oxide film made of a silicon oxide film; 4 is a floating gate made of a polysilicon film; 5 is an oxide film for a control gate; 6 is a control gate; 6a and 6b are a polysilicon film and a tungsten silicide film for the control gate, respectively; 7 is a hard mask film; 8 is a spacer; 8a and 8b are an oxide film and a nitride film for the spacer; and 9 is a source/drain region.

It is a widely known fact that, as technologies develop and a larger amount of information needs to be processed, a memory having larger capacity is required. However, there exist many technical limitations in highly integrating memories. Therefore, new structure and process are strongly required to realize a memory having a satisfactorily large capacity.

SUMMARY OF THE INVENTION

Accordingly, the present invention has been made to solve the above-mentioned problems occurring in the prior art, and an object of the present invention is to provide a non-volatile memory having sufficient capacity and a method for manufacturing the same.

Another object of the present invention is to provide a non-volatile memory having both sufficient capacity and improved integrity and a method for manufacturing the same.

In order to accomplish these objects, there is provided a non-volatile memory including a silicon substrate having a device separation film; a floating gate formed on the silicon substrate; a tunnel oxide film interposed between the silicon substrate and the floating gate below both ends of the floating gate; a ferroelectric substance interposed between the silicon substrate and the floating gate inside the tunnel oxide film; a diffusion barrier film enclosing the ferroelectric substance; a control gate formed on the substrate including the floating gate; a gate oxide film formed below the control gate; spacers formed on both lateral walls of the laminated floating gate and control gate including the tunnel oxide film and gate oxide film, respectively; and source/drain regions formed within the substrate surfaces on both sides of the control gate including the spacers, respectively.

Both sides of the floating gate extend 1-50 nm from the ferroelectric substance in the outward directions, respectively.

The ferroelectric substance is a PZT film and has a thickness of 30-1000 Å.

According to another aspect of the present invention, there is provided a method for manufacturing a non-volatile memory including the steps of providing a silicon substrate having a device separation film; forming a first diffusion barrier film, a ferroelectric substance, and a second diffusion barrier film successively on the entire substrate; patterning the second diffusion barrier film, the ferroelectric substance, and the first diffusion barrier film into a size smaller than that of a desired floating gate; forming a third diffusion barrier film on the entire substrate including the patterned laminated films; etching the third diffusion barrier film to remove a part formed on the substrate; oxidizing the resulting substrate to selectively grow a silicon oxide film only on the substrate surface; forming a first polysilicon film for a floating gate on the silicon oxide film; patterning the first polysilicon film and the silicon oxide film into the shape of lines extending along a direction; forming an oxide film for a control gate, a second polysilicon film for a control gate, a tungsten silicide film, and a hard mask film successively on the entire substrate including the patterned first polysilicon film; ectching the hard mask film, the tungsten silicide film, the second polysilicon film, and the oxide film to form a control gate in the shape of a line extending perpendicularly to the direction and a gate oxide film positioned below the control gate; etching the first polysilicon film and the silicon oxide film to form a floating gate made of the first polysilicon film and a tunnel oxide film positioned below both ends of the floating gate; forming spacers on both lateral walls of the laminated floating gate and control gate, respectively; and forming source/drain regions within the substrate surfaces on both sides of the control gate including the spacers, respectively.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
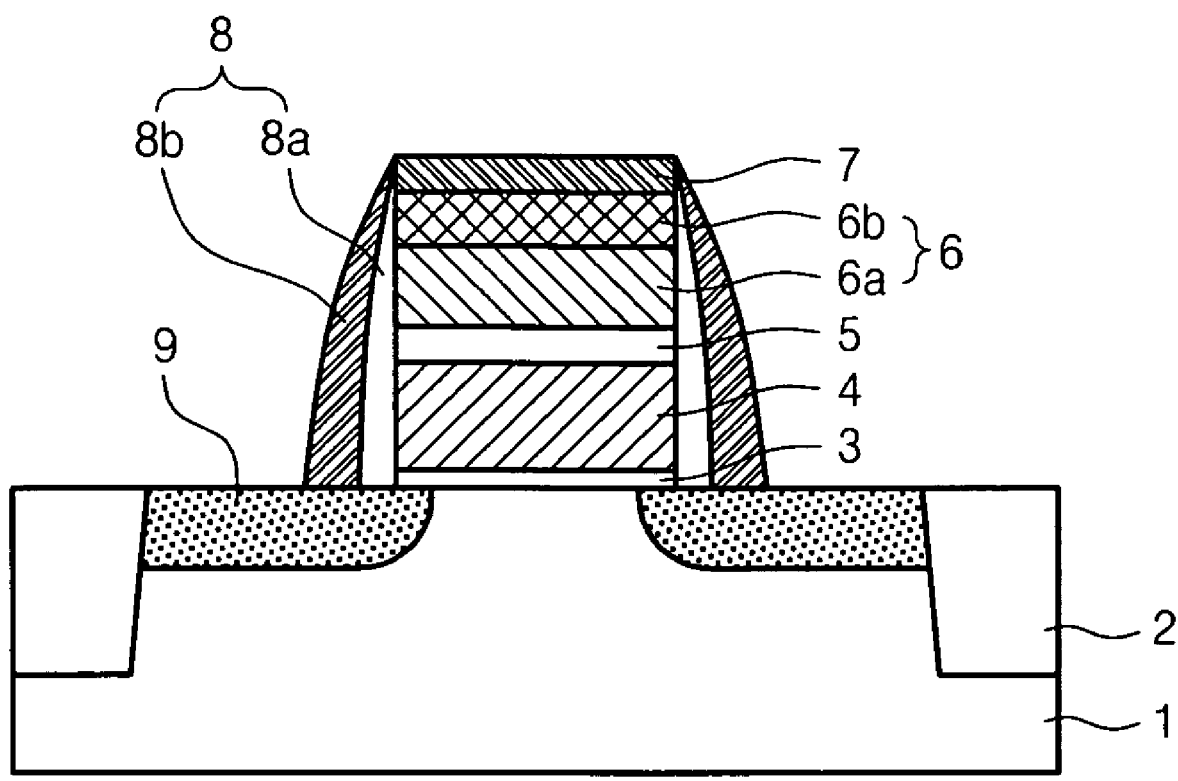
FIG. 1 is a sectional view showing a conventional flash memory cell.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2A:
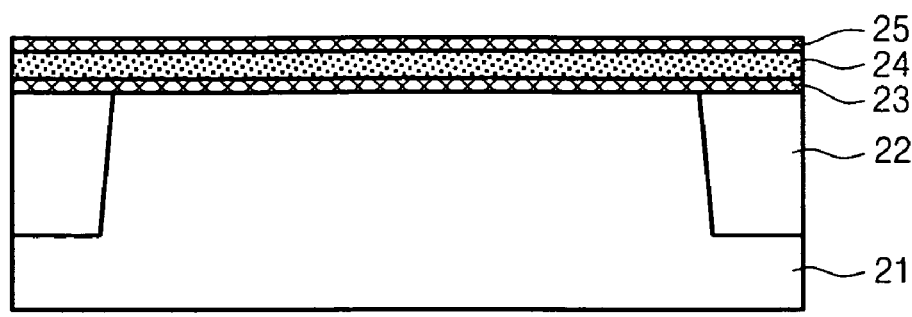
FIGS. 2A to 2F are sectional views showing respective processes of a method for manufacturing a non-volatile memory according to the present invention.
Figure 2B:
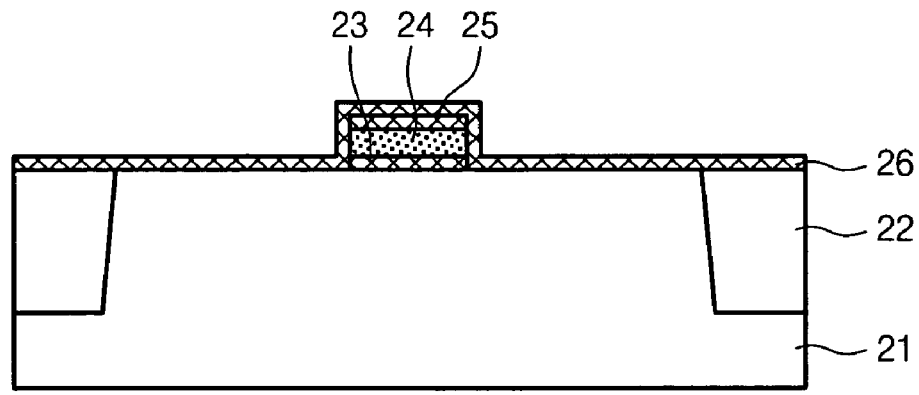
Figure 2C:
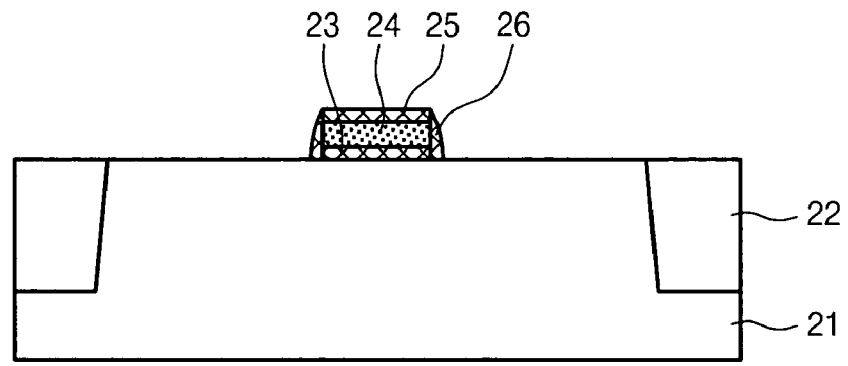
Figure 2D:
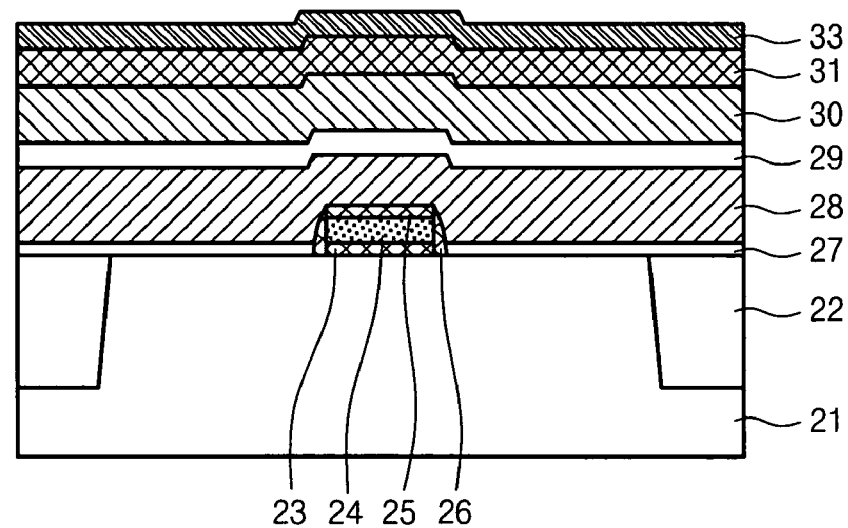
Figure 2E:
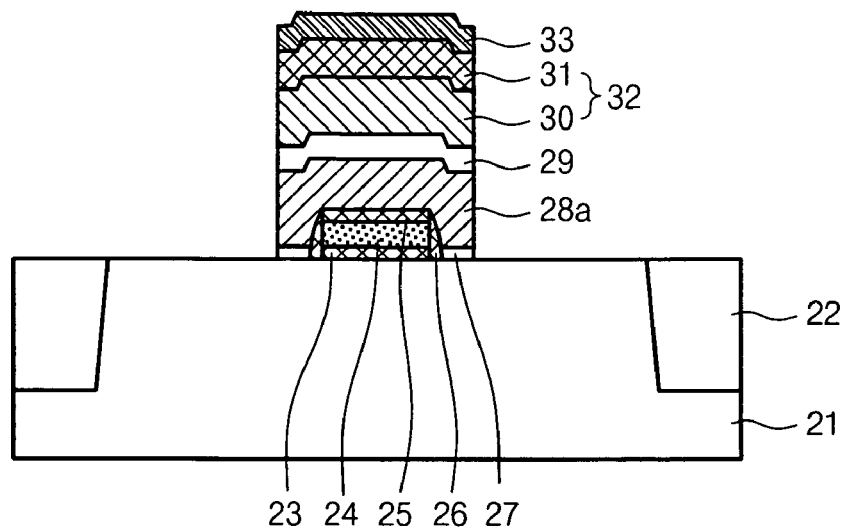
Figure 2F:
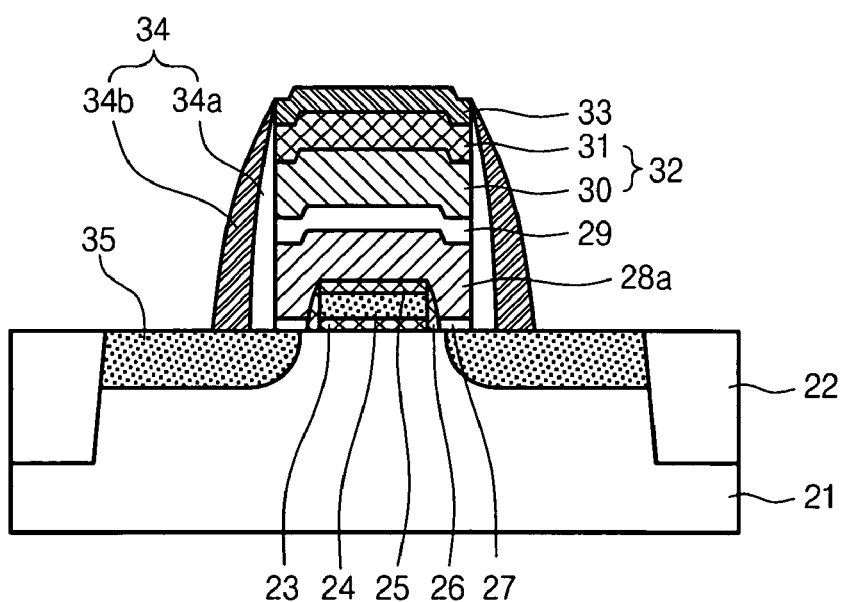

FIG. 2F is a sectional view showing a non-volatile memory according to the present invention. As shown, the inventive memory has the same basic structure as a flash memory. More specifically, an oxide film interposed between a silicon substrate 21 and a floating gate 28a, particularly a tunnel oxide film made of a silicon oxide film 27 is positioned only below both ends of the floating gate 28a and a ferroelectric substance used as a dielectric matter of a ferroelectric capacitor, for example, a PZT [Pb(Zr,Ti)O$_3$] film 24, is positioned therein.

The inventive memory has three data states, not two data states, due to a combination of the electric field direction at the PZT film 24 and electrons injected into the floating gate 28a as thermions. The thermion injection into the floating gate 28a can be realized through the silicon oxide film 27 meeting the drain. Data deletion operation is performed by means of tunneling of electrons in the floating gate 28a to the silicon oxide film 27 of the source end. This means that movement of electrons during writing and deleting operations is realized through a conventional silicon oxide film 27, not the PZT film 24, and the inventive memory can realize stable writing and deleting operations. The inventive memory can also function as a non-volatile memory, because the electrical polarity of the ferroelectric substance and the electrons injected into the floating gate 30 maintain the state even when power is off.

If the PZT film 24 directly contacts the silicon substrate 21 in the inventive non-volatile memory, the lead (Pb) component included in the PZT film 24 may easily react with the silicon (Si) included in the substrate and the PZT film 24 may lose the characteristics of a ferroelectric substance. Therefore, the PZT film 24 is enclosed by a diffusion barrier including TiN films 23, 25, and 26 according to the present invention to interrupt the reaction between the lead (Pb) component and the silicon in the substrate and prevent the PZT film 24 from losing the characteristics of a ferroelectric substance.

As such, the inventive non-volatile memory can exhibit three data states, not two data states, and has larger capacity than a conventional memory exhibiting only two data states. Furthermore, it can have more cells integrated in the same area with the same capacity. This means that the integrity is easily improved.

In FIG. 2F, reference numeral 22 refers to a device separation film; 29 is an oxide film for a control gate; 30 and 31 are a polysilicon film and a tungsten silicide film for a control gate, respectively; 32 is a control gate; 33 is a hard mask film made of a nitride film; 34 is a spacer; 34a and 34b are an oxide film and a nitride film for the spacer, respectively; and 35 is a source/drain region.

The operation of a non-volatile memory according to the present invention will now be described with reference to FIGS. 3A to 3C.

As the cell transistor is operated by applying a voltage to the control gate, the inventive non-volatile memory has one of three threshold voltages depending on the state of the ferroelectric substance and the amount of electrons injected into the floating gate. By applying a gate voltage between threshold voltages of "threshold voltage medium state" and "threshold voltage highest state" and measuring the flowing current, the data stored at the memory cell as one of three states is read out.

Figure 3A:
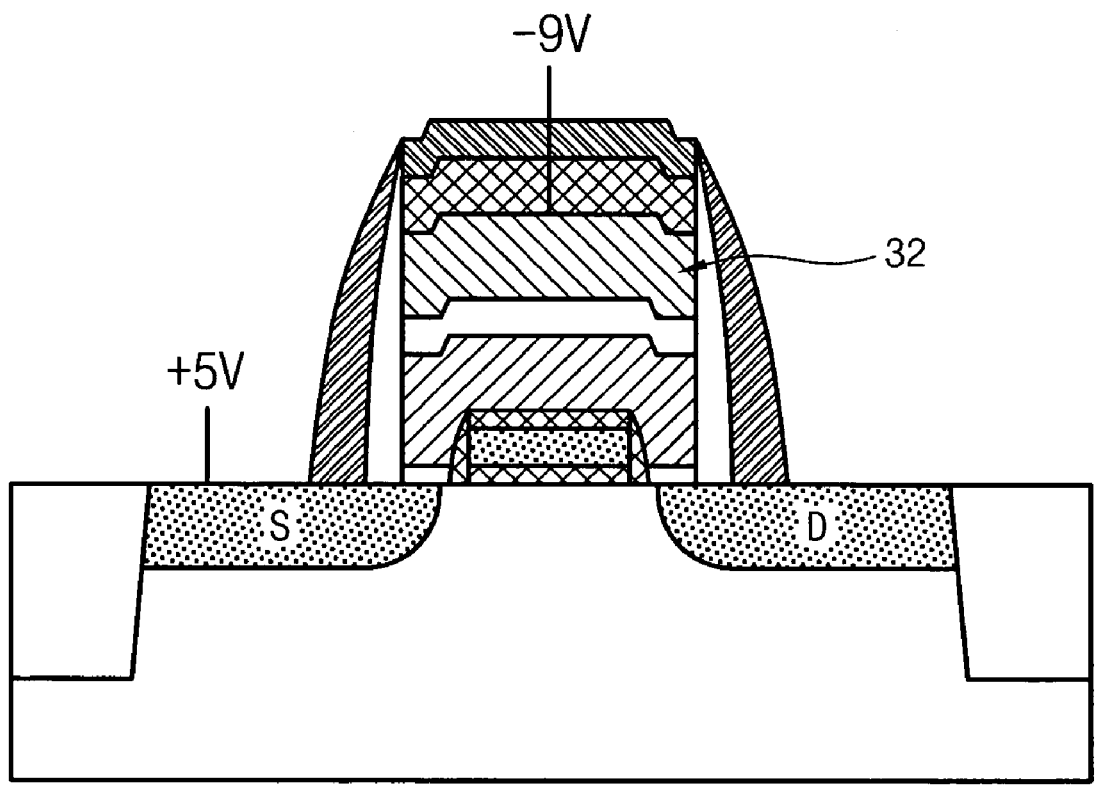
FIGS. 3A to 3C are sectional views showing the operation of a non-volatile memory according to the present invention.
Figure 3A:
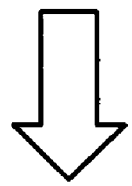
Figure 3A:
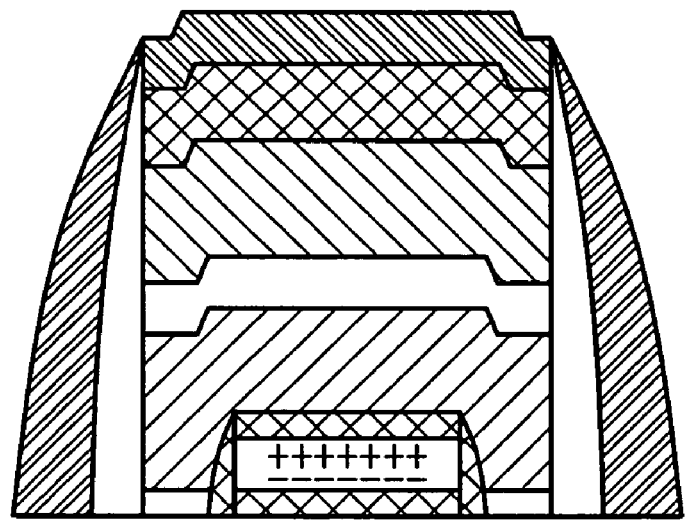

FIG. 3A is a sectional view showing voltage application for deleting data stored in a first state, i.e., "threshold voltage lowest state", and the corresponding internal state of the ferroelectric substance and the floating gate. When −9V is applied to the control gate 32 and +5V is applied to the source region as shown, the ferroelectric substance has (−) polarity at the silicon substrate side and (+) polarity at the floating gate side. With the aid of the electric field of the ferroelectric substance, the threshold voltage then becomes lower than a state before the ferroelectric substance has a polarity (hereinafter, referred to as neutral state). By applying a voltage between "threshold voltage medium state" and "threshold voltage highest state" to the gate in the first state, therefore, the operating current of the transistor is increased.

Figure 3B:
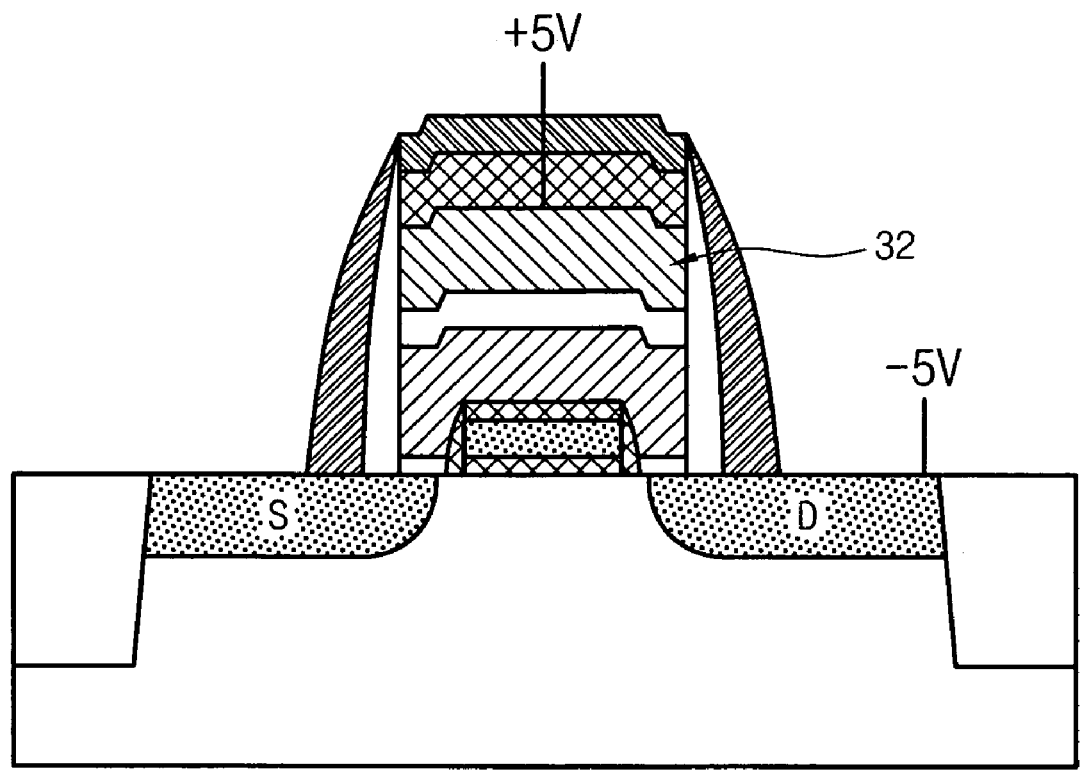
Figure 3B:
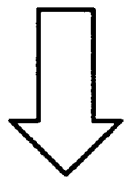
Figure 3B:
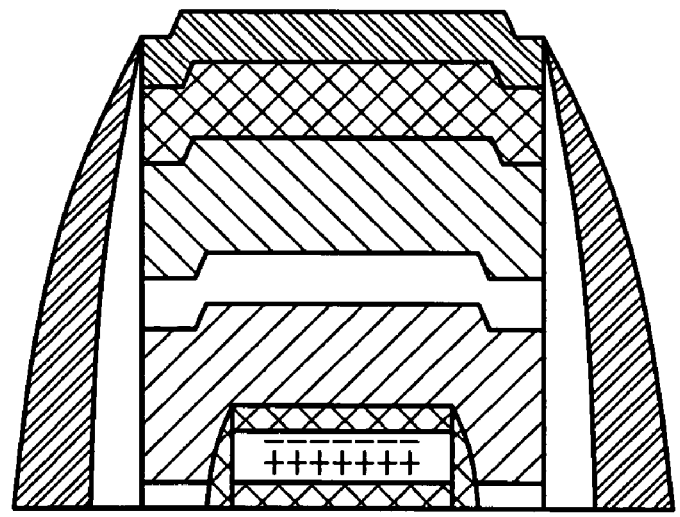

FIG. 3B is a sectional view showing voltage application for storing data in a second state, i.e., "threshold voltage medium state", and the corresponding internal state of the ferroelectric substance and the floating gate. When +5V is applied to the control gate 32 and −5V is applied to the drain region as shown, the ferroelectric substance has (+) polarity at the silicon substrate side and (−) polarity at the floating gate side. The electric field of the ferroelectric substance then has the opposite direction to the gate voltage application direction and the threshold voltage becomes higher than that of a transistor in a neutral state. By applying a gate voltage between "threshold voltage medium state" and "threshold voltage highest state" in the second state, therefore, a small amount of current flows.

Figure 3C:
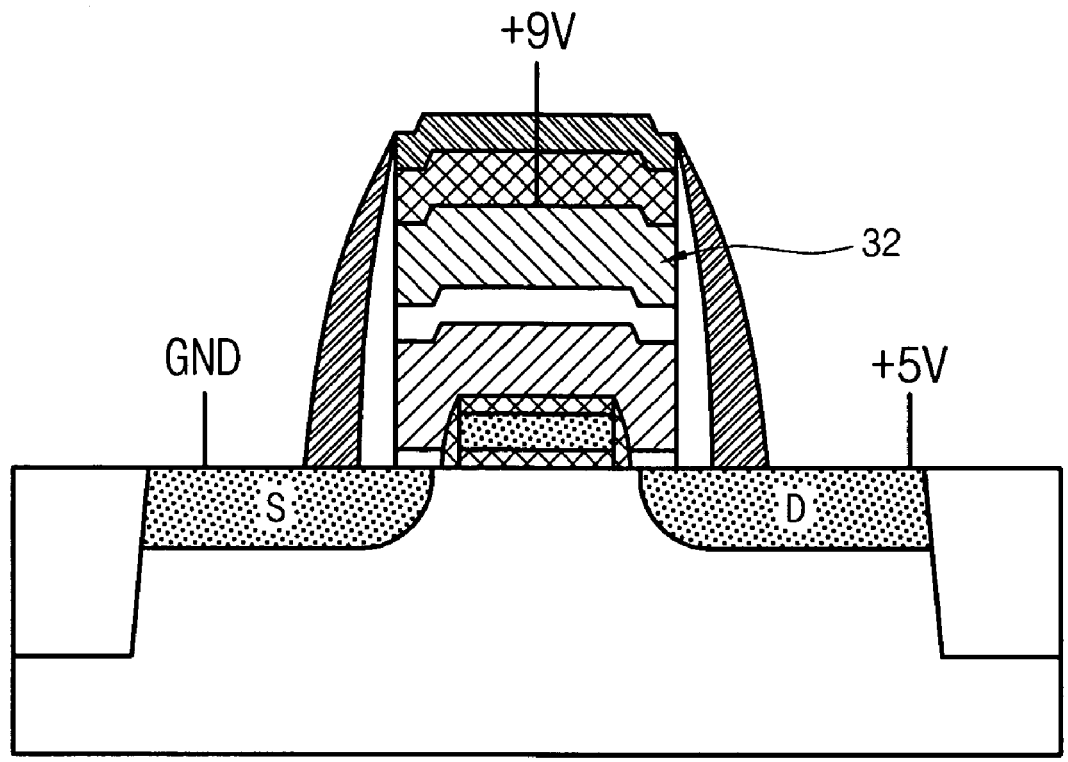
Figure 3C:
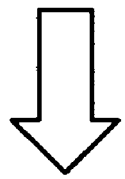
Figure 3C:
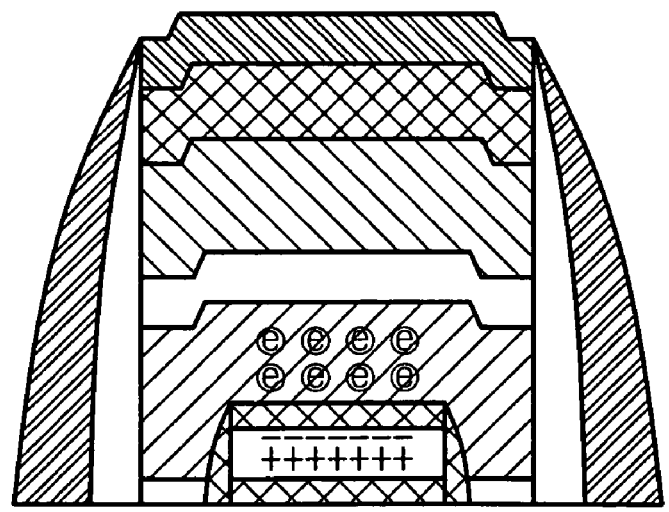

FIG. 3C is a sectional view showing voltage application for storing data in a third state, i.e., "threshold voltage highest state", and the corresponding internal state of the ferroelectric substance and the floating gate. When +9V is applied to the control gate 32, the source region is grounded, and +5V is applied to the drain region as shown, the ferroelectric substance has (+) polarity at the silicon substrate side and (−) polarity at the floating gate side. The floating gate has electrons injected therein through thermion injection and the electric field of the ferroelectric substance has the opposite direction to the gate voltage application direction. Due to the voltage reduction effect caused by electrons, the threshold voltage becomes higher than the case shown in FIG. 3B. By applying a gate voltage between "threshold voltage medium state" and "threshold voltage highest state" in the third state, therefore, no current flows. This is because a voltage lower than the threshold voltage is applied to the gate.

When stored data is to be completely deleted, a voltage is applied as shown in FIG. 3A. Electrons in the floating gate are then tunneled and drained to the source region and the ferroelectric substance has (−) polarity at the silicon substrate side and (+) polarity at the floating gate side. This corresponds to the same device characteristics as in the "threshold voltage lowest state."

As such, the inventive non-volatile memory can exhibit three data states of "threshold voltage lowest state," "threshold voltage medium state," and "threshold voltage highest state" with a single memory cell. This means that it can store more data than a conventional memory capable of exhibiting two data states and secure larger capacity in the same area with improved integrity.

A method for manufacturing a non-volatile memory device according to the present invention, configured as above, will now be described with reference to FIGS. 2A to 2F.

Referring to FIG. 2A, a silicon substrate 21 having a device separation film 22 formed thereon in a conventional STI (shallow trench isolation) process to define an active region, as well as a P-well (not shown) formed therein, is provided. A first TiN film 23, a PZT film 24 which is a ferroelectric substance, and a second TiN film 25 are successively formed on the entire substrate 21 including the device separation film 22. The first and second TiN films 23 and 25 act as barrier films to interrupt reaction between the lead (Pb) component of the PZT film 24 which is a ferroelectric substance and the substrate silicon. The first and second TiN films 23 and 25 are formed with a thickness of 20-500 Å and the PZT film 24 is formed with a thickness of 30-1000 Å.

Instead of the PZT film 24, an $Al_2O_3$ film may be formed with a thickness of 30-1000 Å as the ferroelectric substance.

Referring to FIG. 2B, a mask process and an anisotropic etching process are successively performed to pattern the second TiN film 25, the PZT film 24, and the first TiN film 23. The patterning of the laminated films is preferably performed in such a manner that the remaining PZT film 24 has a position and a shape to be positioned only inside the floating gate, which is to be formed in a following process, except both ends thereof. A third TiN film 26 is then formed on the entire substrate including the patterned laminated films. The third TiN film 26 also acts as a barrier film to interrupt reaction between the lead (Pb) component of the PZT film 24 and the substrate silicon.

Referring to FIG. 2C, the third TiN film 26 is subject to anisotropic etching to remove a part formed on the substrate. A part of the third TiN film deposited on the second TiN film 25 is removed together. As a result, the third TiN film 26 is left only on the lateral wall of the patterned laminated films and the PZT 24 film, which is a ferroelectric substance, is enclosed by the first, second, and third TiN films 23, 25, and 26.

Referring to FIG. 2D, the resulting substrate is subject to a gate oxidation process to selectively grow a silicon oxide film 27 on the exposed surface of the substrate. A first polysilicon film 28 for a floating gate is then formed on the entire substrate including the silicon oxide film 27. Although not shown in the drawing, a mask process and an isotropic etching process are successively performed to pattern the first polysilicon film 28 for a floating gate and the silicon oxide film 27 into the shape of lines extending along a direction, for example, along X-direction in the drawing.

Subsequently, an oxide film 29 for a control gate, as well as a second polysilicon film 30 and a tungsten silicide film 31 as conductive films for the control gate, are successively formed on the entire substrate including the patterned first polysilicon film 28 for a floating gate. A hard mask film 33 made of, e.g., a nitride film, is then formed on the tungsten silicide film 31.

Referring to FIG. 2E, the hard mask film 33 is patterned into the shape of a control gate in a conventional process. The patterned hard mask film 33 is then used as an etching mask to etch the tungsten silicide film 31, the second polysilicon film 30, and the oxide film 29 for a control gate and form a control gate 32 in the shape of a line extending, e.g., along Y-direction in the drawing. The first polysilicon film and the silicon oxide film 27 are then etched to form a floating gate 29a made of the first polysilicon.

The tunnel oxide film made of the silicon oxide film 27 is positioned only below both ends of the floating gate 28a and the PZT film 24 is positioned inside the silicon oxide film 27. Preferably, both ends of the floating gate 28a extend 1-50 nm from the PZT film 24 in the outward directions, respectively.

Referring to FIG. 2F, an oxide film 34a and a nitride film 34b are successively formed on the entire substrate including the control gate 32 and are subject to blanket etching to form spacers 34 on both lateral walls of the laminated floating gate 28a and control gate 32, respectively. The resulting substrate is subject to high-density ion injection of n-type impurity to form source/drain regions 35 in the substrate active regions on both sides of the laminated floating gate 28a and control gate 32, including the spacers, respectively. This completes the manufacturing of a non-volatile memory cell having three data states according to the present invention.

As mentioned above, the present invention uses the basic structure of a flash memory and positions a tunnel oxide film made of a silicon oxide film only on both ends of the floating gate and a ferroelectric substance therein to manufacture a memory cell having three data states by means of a combination of the electric field direction at the ferroelectric substance and the electrons injected into the floating gate as thermions. Therefore, the present invention can provide three data states with a single memory cell. This means that a memory having larger capacity can be manufactured in the same area. Alternatively, higher integration can be realized with the same capacity.

In addition, the inventive memory device functions as a non-volatile memory and data stored in the memory cell is not erased even when power is off. Therefore, it can be advantageously used for a portable appliance having a large amount of information to process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A non-volatile memory comprising: a silicon substrate having a drain, a source and a device separation film; a floating gate formed on the silicon substrate; a pair of opposing tunnel oxide films interposed between the silicon substrate and opposing lateral ends of the floating gate, one tunnel oxide film interposed between the drain and only one lateral end of the floating gate, the other tunnel oxide film Interposed between the source and the other lateral end of the floating gate; a ferroelectric substance interposed between the silicon substrate and the floating gate and between the tunnel oxide films; a diffusion barrier film encasing completely around the ferroelectric substance; a control gate formed on the substrate including the floating gate; a gate oxide film formed below the control gate; spacers formed on both lateral walls of the laminated floating gate and control gate including the tunnel oxide film and gate oxide film, respectively; and the source/drain formed within the substrate surfaces on both sides of the control gate including the spacers, respectively.

2. The non-volatile memory as claimed in claim 1, wherein both lateral sides of the floating gate extend over and beyond about 1-50 nm away from lateral sides of the ferroelectric substance.

3. The non-volatile memory as claimed in claim 1, wherein the ferroelectric substance is a PZT film.

4. The non-volatile memory as claimed in claim 1, wherein the ferroelectric substance has a thickness of 30-1000 Å.

5. The non-volatile memory as claimed in claim 1, wherein the diffusion barrier film is a TiN film or an $Al_2O_3$ film.

6. The non-volatile memory as claimed in claim 1, wherein the diffusion barrier film has a thickness of 20-500 Å.

* * * * *